(12) United States Patent
Onozawa et al.

(10) Patent No.: US 11,676,960 B2
(45) Date of Patent: Jun. 13, 2023

(54) SEMICONDUCTOR DEVICE

(71) Applicant: FUJI ELECTRIC CO., LTD., Kanagawa (JP)

(72) Inventors: Yuichi Onozawa, Matsumoto (JP); Kota Ohi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 298 days.

(21) Appl. No.: 17/000,355

(22) Filed: Aug. 23, 2020

(65) Prior Publication Data
US 2020/0388611 A1    Dec. 10, 2020

Related U.S. Application Data

(63) Continuation of application No. 15/885,832, filed on Feb. 1, 2018, now Pat. No. 10,770,453, which is a
(Continued)

(30) Foreign Application Priority Data

Feb. 15, 2016   (JP) .............................. JP2016-026403

(51) Int. Cl.
   *H01L 29/06*   (2006.01)
   *H01L 29/08*   (2006.01)
   (Continued)

(52) U.S. Cl.
   CPC ........ *H01L 27/0629* (2013.01); *H01L 21/266* (2013.01); *H01L 21/2652* (2013.01);
   (Continued)

(58) Field of Classification Search
   CPC ............. H01L 27/0727; H01L 27/0629; H01L 29/0696; H01L 29/7393; H01L 29/1095;
   (Continued)

(56) References Cited

U.S. PATENT DOCUMENTS 5,977,570 A * 11/1999 Takahashi ......... H01L 29/66378
                                                257/E21.384
10,056,450 B2   8/2018 Kouno
(Continued)

FOREIGN PATENT DOCUMENTS

CN       105097508 A    11/2015
JP       2007-266134 A  10/2007
(Continued)

OTHER PUBLICATIONS

Office Action issued for counterpart Japanese Application No. 2019-202572, issued by the Japan Patent Office dated Feb. 24, 2021 (drafted on Feb. 16, 2021).
(Continued)

*Primary Examiner* — Mohsen Ahmadi

(57) ABSTRACT

A semiconductor device is provided that has a semiconductor substrate, a drift layer of a first conductivity type formed in the semiconductor substrate, a base region of a second conductivity type formed in the semiconductor substrate and above the drift layer, and an accumulation region of the first conductivity type provided between the drift layer and the base region and having an impurity concentration higher than an impurity concentration in the drift layer, wherein the accumulation region has a first accumulation region and a second accumulation region that is formed more shallowly than the first accumulation region is and on a side of a boundary with a region that is different from the accumulation region in a planar view.

26 Claims, 12 Drawing Sheets

Related U.S. Application Data continuation of application No. PCT/JP2017/005601, filed on Feb. 15, 2017.

(51) Int. Cl.

| | | |
|---|---|---|
| *H01L 29/10* | (2006.01) | |
| *H01L 29/40* | (2006.01) | |
| *H01L 29/423* | (2006.01) | |
| *H01L 29/739* | (2006.01) | |
| *H01L 29/78* | (2006.01) | |
| *H01L 29/66* | (2006.01) | |
| *H01L 29/732* | (2006.01) | |
| *H01L 29/861* | (2006.01) | |
| *H01L 21/265* | (2006.01) | |
| *H01L 21/8249* | (2006.01) | |
| *H01L 27/06* | (2006.01) | |
| *H01L 27/07* | (2006.01) | |
| *H01L 21/266* | (2006.01) | |

(52) U.S. Cl.
CPC .... *H01L 21/26586* (2013.01); *H01L 21/8249* (2013.01); *H01L 27/0727* (2013.01); *H01L 29/0615* (2013.01); *H01L 29/0696* (2013.01); *H01L 29/0834* (2013.01); *H01L 29/1095* (2013.01); *H01L 29/407* (2013.01); *H01L 29/4238* (2013.01); *H01L 29/7397* (2013.01); *H01L 29/78* (2013.01); *H01L 29/0692* (2013.01); *H01L 29/0804* (2013.01); *H01L 29/6634* (2013.01); *H01L 29/7325* (2013.01); *H01L 29/8613* (2013.01)

(58) Field of Classification Search
CPC .............. H01L 29/7302; H01L 29/0804; H01L 29/7325; H01L 29/6634; H01L 29/41708
See application file for complete search history.

(56) References Cited

U.S. PATENT DOCUMENTS

| | | | |
|---|---|---|---|
| 10,062,753 B2 | 8/2018 | Kouno | |
| 10,361,191 B2 | 7/2019 | Takahashi | |
| 2003/0201455 A1* | 10/2003 | Takahashi | H01L 29/66356 257/E29.336 |
| 2007/0215898 A1* | 9/2007 | Ozeki | H01L 29/7397 257/E29.013 |
| 2008/0048295 A1 | 2/2008 | Takahashi | |
| 2008/0224207 A1* | 9/2008 | Sakamoto | H01L 29/0834 257/E29.345 |
| 2009/0230500 A1 | 9/2009 | Yoshikawa | |
| 2009/0294870 A1 | 12/2009 | Arai | |
| 2012/0080718 A1 | 4/2012 | Soeno | |
| 2012/0267680 A1 | 10/2012 | Oya | |
| 2013/0037853 A1 | 2/2013 | Onozawa | |
| 2013/0082301 A1 | 4/2013 | Onozawa | |
| 2014/0319576 A1 | 10/2014 | Kobayashi | |
| 2014/0339600 A1 | 11/2014 | Yoshikawa | |
| 2015/0144995 A1 | 5/2015 | Takahashi | |
| 2016/0027906 A1 | 1/2016 | Onozawa | |
| 2016/0043073 A1 | 2/2016 | Tamura | |
| 2016/0079235 A1* | 3/2016 | Matsu | H01L 29/0603 257/140 |
| 2016/0141400 A1 | 5/2016 | Takahashi | |
| 2016/0336404 A1 | 11/2016 | Naito | |
| 2016/0336435 A1 | 11/2016 | Naito | |
| 2017/0018547 A1* | 1/2017 | Naito | H01L 29/8613 |
| 2017/0018636 A1 | 1/2017 | Naito | |
| 2017/0025522 A1* | 1/2017 | Naito | H01L 29/407 |
| 2017/0077217 A1 | 3/2017 | Ogawa | |
| 2017/0271447 A1 | 9/2017 | Tamura | |

FOREIGN PATENT DOCUMENTS

| | | |
|---|---|---|
| JP | 2008-053648 A | 3/2008 |
| JP | 2012028567 A | 2/2012 |
| JP | 2012-043890 A | 3/2012 |
| JP | 2012227335 A | 11/2012 |
| JP | 2013021104 A | 1/2013 |
| JP | 2015-103697 A | 6/2015 |
| JP | 2015185742 A | 10/2015 |
| JP | 2016096222 A | 5/2016 |
| JP | 2017059711 A | 3/2017 |
| WO | 2010/143288 A1 | 12/2010 |
| WO | 2013179761 A1 | 12/2013 |
| WO | 2016030966 A1 | 3/2016 |

OTHER PUBLICATIONS

Office Action issued for counterpart Chinese Application 201780002602.2, issued by the China National Intellectual Property Administration dated Aug. 28, 2020.

International Search Report for International Patent Application No. PCT/JP2017/005601, issued by the Japan Patent Office dated Apr. 4, 2017.

U.S. Appl. No. 15/885,832, filed Feb. 21, 2018, to Yuichi Onozawa.

\* cited by examiner

SEMICONDUCTOR DEVICE

CROSS-REFERENCE TO RELATED APPLICATIONS

This application is a continuation application of U.S. patent application Ser. No. 15/885,832, filed on Feb. 1, 2018, which is a continuation of International Application No. PCT/JP2017/005601, filed on Feb. 15, 2017, which claims priority to Japanese Patent Application No. 2016-026403, filed on Feb. 15, 2016, the contents of each of which are hereby incorporated herein by reference in their entirety.

BACKGROUND

1. Technical Field

The invention relates to a semiconductor device.

2. Related Art

Conventionally, it has been known that in a semiconductor device having trench portions, a stored layer having a high concentration is formed between the trench portions (for example, see Patent Document 1). Also, if the stored layer is formed by ion implantation, the ion implantation is performed at a predetermined angle in order to prevent channeling.

Patent Document 1: Japanese Patent Application Publication No. 2012-43890

However, because the ion implantation is performed at a predetermined angle on conventional semiconductor devices, the ions are decelerated in the vicinity of a resist for the ion implantation. In the region in which the ions are decelerated, the stored layer may be shallowly formed, and then the gate threshold may be lowered in some cases.

SUMMARY

A first aspect of the present invention provides a semiconductor device that has a semiconductor substrate, a drift layer of a first conductivity type formed in the semiconductor substrate, a base region of a second conductivity type formed in the semiconductor substrate and above the drift layer, and an accumulation region of the first conductivity type provided between the drift layer and the base region and having an impurity concentration higher than an impurity concentration in the drift layer, wherein the accumulation region has a first accumulation region and a second accumulation region that is formed more shallowly than the first accumulation region is and on a side of a boundary with a region that is different from the accumulation region in a planar view.

The semiconductor device may include a transistor portion formed in the semiconductor substrate. The transistor portion may have a plurality of trench portions that are formed in a front surface of the semiconductor substrate and are arrayed in a predetermined direction and have, in the front surface of the semiconductor substrate, an emitter region of the first conductivity type having an impurity concentration higher than the impurity concentration in the drift layer formed between the plurality of trench portions. The first accumulation region and the second accumulation region may be formed between the plurality of trench portions.

At one end of an array direction in the transistor portion, the transistor portion may have a boundary region in which the emitter region is not formed between the plurality of trench portions.

At both of one end of an array direction in the transistor portion and other end opposite to the one end, the transistor portion may have a boundary region in which the emitter region is not formed between the plurality of trench portions.

A width of the second accumulation region in the boundary region may be equal to a width of a mesa surrounded by the plurality of trench portions.

In the front surface of the semiconductor substrate in the boundary region, the semiconductor substrate may have a contact region of the second conductivity type having an impurity concentration higher than an impurity concentration in the base region.

In the boundary region, the drift layer may be connected to the base region.

A depth of the second accumulation region may gradually vary in a direction parallel to the front surface of the semiconductor substrate.

The semiconductor device may further include a diode portion formed in the semiconductor substrate. The boundary region may be formed in the transistor portion on a side of a boundary with the diode portion.

The second accumulation region may include a region formed at a depth at least as deep as a central position of the base region in a depth direction.

An impurity concentration at a lower end of the second accumulation region may be lower than an impurity concentration at a lower end of the first accumulation region.

The semiconductor device may further include a well region of the second conductivity type in the front surface of the semiconductor substrate on an extending direction side to which the transistor portion extends in a planar view. The second accumulation region may be formed in the accumulation region on a side of a boundary with the well region in a planar view.

A second aspect of the present invention provides a semiconductor device that has a semiconductor substrate, a drift layer of a first conductivity type formed in the semiconductor substrate, a base region of a second conductivity type formed in the semiconductor substrate and above the drift layer, an accumulation region of the first conductivity type provided between the drift layer and the base region and having an impurity concentration higher than an impurity concentration in the drift layer, and a plurality of trench portions that are formed in a front surface of the semiconductor substrate and are arrayed in a predetermined array direction, wherein, at one end of the array direction of the plurality of trench portions, the accumulation region has a first accumulation region and a second accumulation region that is formed more shallowly than the first accumulation region is and on a side of a boundary with a region that is different from the accumulation region in a planar view.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Example 1

Figure 1:
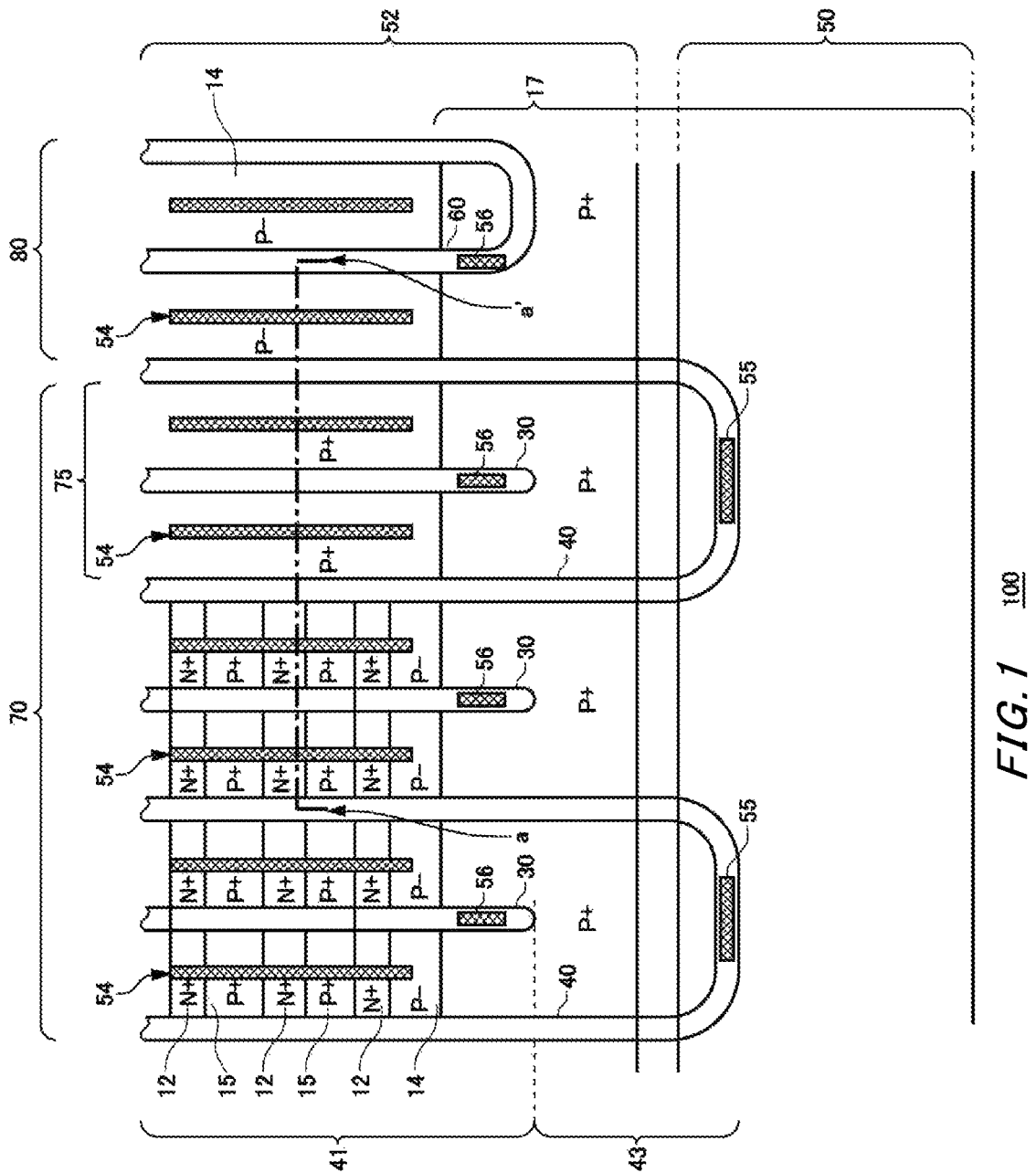
FIG. 1 is a plan view showing one example of a semiconductor device 100 according to Example 1.
Figure 1:
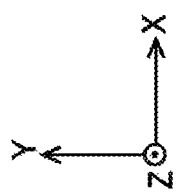

FIG. 1 is a plan view showing one example of a semiconductor device 100 according to Example 1. The semiconductor device 100 of the present example is a semiconductor chip that has a transistor portion 70 including a transistor such as an IGBT (Insulated Gate Bipolar Transistor) and a diode portion 80 including a diode such as an FWD (Free Wheel Diode). Also, the transistor portion 70 has a boundary region 75 on the side of the boundary between the transistor portion 70 and the diode portion 80 in a planar view. FIG. 1 illustrates a front surface of a chip around an end portion of the chip, while the other regions are omitted.

In the present specification, the X direction and the Y direction are directions perpendicular to each other, and the Z direction is a direction perpendicular to the X-Y plane. The X direction, the Y direction, and the Z direction form a so-called right-handed system. The semiconductor substrate of the present example has a front surface in the +Z direction and has a back surface in the −Z direction. Note that terms "upper" and "above" mean the +Z direction. On the other hand, the terms "lower" and "below" mean the −Z direction.

Also, FIG. 1 shows an active region of the semiconductor substrate of the semiconductor device 100, and the semiconductor device 100 may have an edge termination region surrounding the active region. The active region refers to a region in which the current flows when the semiconductor device 100 is controlled to be in the ON state. The edge termination region relaxes electric field concentration on the front surface side of the semiconductor substrate. The edge termination region has, for example, a guard ring, a field plate, a RESURF (reduced surface field), or a structure of a combination thereof.

On the front surface side of the chip, the semiconductor device 100 of the present example has a gate metal layer 50, an emitter electrode 52, a gate trench portion 40, a dummy trench portion 30, an emitter trench portion 60, a well region 17, an emitter region 12, a base region 14, a contact region 15, and contact holes 54, 55, 56.

Inside the semiconductor substrate on the front surface side, the gate trench portion 40, the dummy trench portion 30, the emitter trench portion 60, the well region 17, the emitter region 12, the base region 14, and the contact region 15 are formed. The emitter electrode 52 and the gate metal layer 50 are provided above the front surface of the semiconductor substrate. Although an interlayer insulating film is formed between the front surface of the semiconductor substrate, and the emitter electrode 52 and the gate metal layer 50, it is omitted in FIG. 1.

The contact holes 54, 55, 56 are formed to penetrate the interlayer insulating film formed above the semiconductor substrate. The positions at which the contact holes 54, 55, 56 are formed are not particularly limited to those of the present example.

The emitter electrode 52 is formed above the gate trench portion 40, the dummy trench portion 30, the emitter trench portion 60, the well region 17, the emitter region 12, the base region 14, and the contact region 15. The emitter electrode 52 contacts the semiconductor substrate through the contact holes 54 and 56. The emitter electrode 52 is formed of metal-containing material. In one example, at least a partial region of the emitter electrode 52 is formed of aluminum. The emitter electrode 52 may also have a region formed of tungsten-containing material. The emitter electrode 52 of the present example is provided to correspond to each of the transistor portion 70 and the diode portion 80.

The gate metal layer 50 contacts the semiconductor substrate through the contact hole 55. However, the gate metal layer 50 is not formed above the dummy trench portion 30 and the emitter trench portion 60. The gate metal layer 50 is formed of metal-containing material. In one example, at least a partial region of the gate metal layer 50 is formed of aluminum. The gate metal layer 50 may also have a region formed of tungsten-containing material. The gate metal layer 50 of the present example is provided to correspond to each of the transistor portion 70 and the diode portion 80. The gate metal layer 50 of the present example is formed of the same material as that of the emitter electrode 52. However, the gate metal layer 50 may be formed of a material different from that of the emitter electrode 52.

The dummy trench portion 30 is formed to extend in a predetermined extending direction in the front surface of the semiconductor substrate. In a region of the transistor portion 70, one or more dummy trench portions 30 are arrayed along a predetermined array direction at a predetermined interval between the dummy trench portion 30 and the gate trench portion 40. The dummy trench portion 30 of the present example has a linear shape and is formed to extend in a direction perpendicular to the array direction. In the present specification, the array direction of the trench portions refers to the X axis direction while the extending direction of the trench portion refers to the Y axis direction.

The gate trench portion 40 has an opposing portion 41 and a protruding portion 43. The opposing portion 41 is formed to extend in the above described extending direction in a range in which the opposing portion 41 is opposed to the dummy trench portion 30. That is, the opposing portion 41 is formed to be parallel to the dummy trench portion 30. The protruding portion 43 further extends from the opposing portion 41 to be formed in a range in which the opposing portion 41 is not opposed to the dummy trench portion 30.

In the present example, two opposing portions 41 provided on both sides of the dummy trench portion 30 are connected by one protruding portion 43. At least part of the protruding portion 43 may have a curved shape.

The gate trench portions 40 and the dummy trench portions 30 of the present example are alternately arranged in a predetermined array direction. Also, the respective trench portions may be arranged at constant intervals. However, the arrangement of the respective trenches is not limited to the above-described example. A plurality of gate trench portions 40 may be arranged between two dummy trench portions 30. Also, the number of the gate trench portions 40 provided between the respective dummy trench portions 30 may not be constant.

The contact hole 55 is formed in the insulating layer covering the protruding portion 43. In the protruding portion 43, the contact hole 55 may be formed in a region that is the most distant from the opposing portion 41. In the region that is the most distant from the opposing portion 41, the protruding portion 43 of the present example has a portion extending in a direction orthogonal to the opposing portion 41. The contact hole 55 may be formed in this portion of the protruding portion 43.

The emitter trench portion 60 is provided in a region of the diode portion 80. The emitter trench portion 60 may have a shape similar to that of the gate trench portion 40. However, the length of the emitter trench portion 60 in the extending direction may be shorter than that of the gate trench portion 40. The length of the emitter trench portion 60 of the present example is the same as that of the dummy trench portion 30.

The well region 17 is formed in a predetermined range from the side on which the gate metal layer 50 is provided. Partial regions of the dummy trench portion 30, the emitter trench portion 60, and the opposing portion 41 on the gate metal layer 50 side are formed in the well region 17. The entire protruding portion 43 may be formed in the well region 17. The semiconductor substrate has a first conductivity type, and the well region 17 has a second conductivity type which is different from that of the semiconductor substrate. The semiconductor substrate of the present example is N$^-$-type, and the well region 17 is P$^+$-type. In the present example, the first conductivity type is described as N-type and the second conductivity type is described as P-type. However, the first conductivity type may be P-type while the second conductivity type may be N-type.

The base region 14 is formed in a region sandwiched between the respective trench portions. The base region 14 is the second conductivity type at an impurity concentration lower than that of the well region 17. The base region 14 of the present example is P$^-$-type.

On the front surface of the base region 14, the contact region 15 is a region of the second conductivity type having an impurity concentration higher than that of the base region 14. The contact region 15 of the present example is P$^+$-type. In the transistor portion 70, the emitter region 12 is selectively formed on part of the front surface of the contact region 15 and as a region of the first conductivity type having an impurity concentration higher than that of the semiconductor substrate. The emitter region 12 of the present example is N$^+$-type.

Each of the contact region 15 and the emitter region 12 is formed from one of adjacent trench portions to the other trench portion. One or more contact regions 15 and one or more emitter regions 12 in the transistor portion 70 are formed to be alternately exposed along the extending direction of the trench portion in regions sandwiched between the respective trench portions.

In the transistor portion 70, the contact hole 54 is formed above the respective regions of the contact region 15, the emitter region 12, and the dummy trench portion 30. The contact hole 54 of the present example is formed across the emitter region 12 and the contact region 15. The contact hole 54 may be formed to expose the entire front surface of the emitter region 12. Also, the contact hole 54 may be formed to expose the entire front surface of the contact region 15. However, the contact hole 54 is not formed in regions which correspond to the base region 14 and the well region 17.

Also, in the diode portion 80, the contact hole 54 is formed above the respective regions of the contact region 15, the base region 14, and the emitter trench portion 60. In the present example, the contact hole 54 in the transistor portion 70 and the contact hole 54 in the diode portion 80 have the same length in the extending direction of each trench portion.

In the transistor portion 70, the boundary region 75 is formed in the vicinity of a boundary between the transistor portion 70 and a region other than the transistor portion 70 in a planar view. The boundary region 75 may also be provided in the vicinity of any of a boundary between the transistor portion 70 and another region in the X axis direction, and a boundary between the transistor portion 70 and another region in the Y axis direction. The boundary region 75 of the present example is formed in the transistor portion 70 on the positive side of the X axis direction, which is the side of the boundary with the diode portion 80. The boundary region 75 includes the dummy trench portion 30 and the gate trench portion 40. The boundary region 75 does not have the emitter region 12 in the front surface of the semiconductor substrate. For example, the boundary region 75 has the contact region 15 in the front surface of the semiconductor substrate. Also, the boundary region 75 may have the base region 14 in the front surface of the semiconductor substrate.

Figure 2:
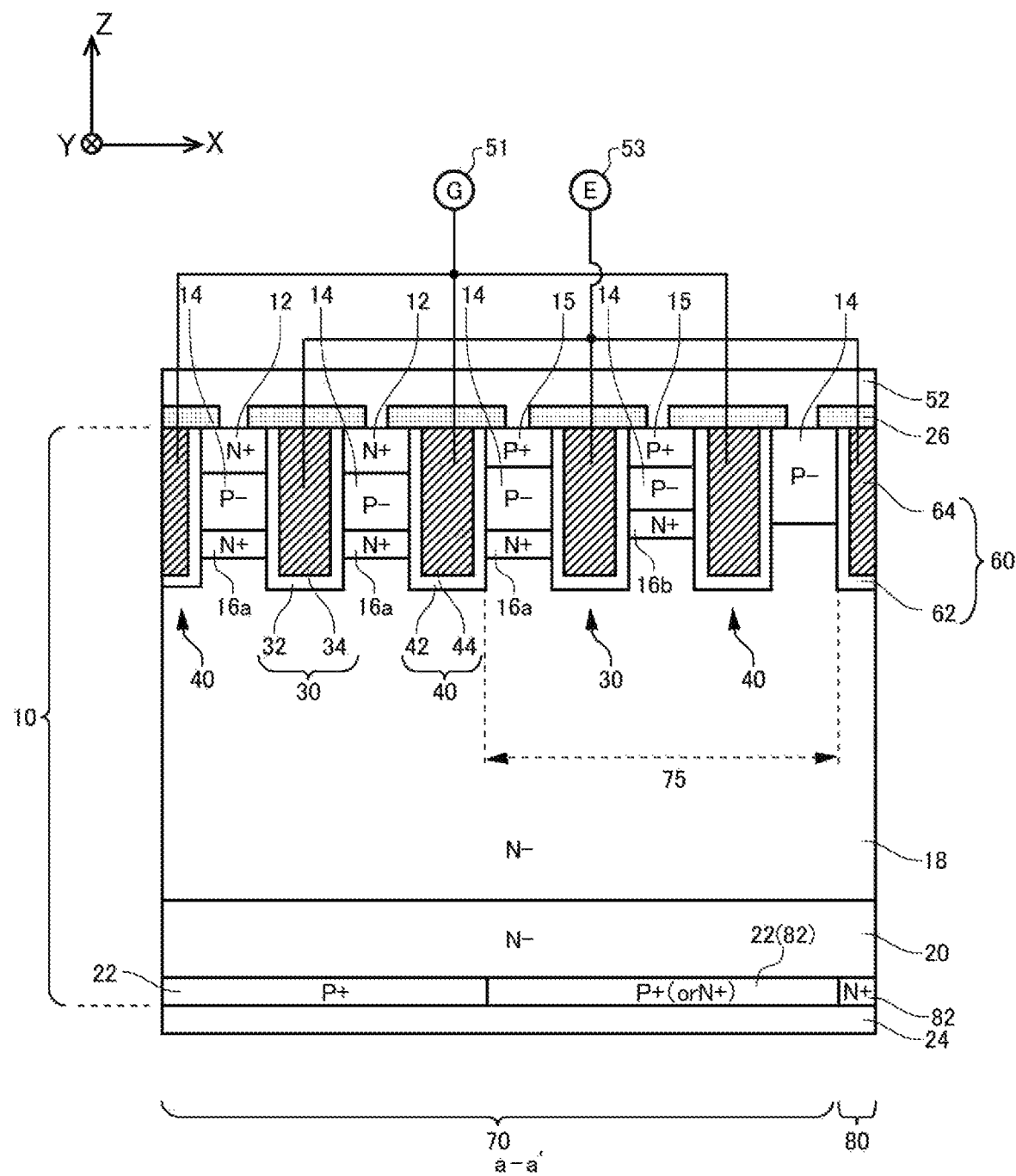
FIG. 2 is a diagram showing one example of a cross section taken along a-a' in the semiconductor device 100 according to the Example 1.

FIG. 2 is a diagram showing one example of a cross section taken along a-a' in the semiconductor device 100 according to the Example 1. At the cross section, the semiconductor device 100 of the present example has a semiconductor substrate 10, the emitter electrode 52, and a collector electrode 24. The emitter electrode 52 is formed on the front surface of the semiconductor substrate 10. The emitter electrode 52 is electrically connected to an emitter terminal 53.

The collector electrode 24 is formed on the back surface of the semiconductor substrate 10. The collector electrode 24 is electrically connected to a collector terminal. The emitter electrode 52 and the collector electrode 24 are formed of conductive material such as metal. Also, in the present specification, for each component such as a substrate, a layer and a region, the surface on the emitter electrode 52 side is referred to as the front surface and the surface on the collector electrode 24 side is referred to as the back surface or the bottom portion. Also, the directions connecting the emitter electrode 52 and the collector electrode 24 are referred to as the depth directions.

The semiconductor substrate 10 may be a silicon substrate, or may also be a compound semiconductor substrate, such as a silicon carbide substrate and a nitride semiconductor substrate, or the like. The base region 14 of P$^-$-type is formed on the front surface side of the semiconductor substrate 10. Also, the emitter region 12 of N$^+$-type is selectively formed in (a) partial region(s) on the front surface side of the base region 14. Also, the semiconductor substrate 10 further has an accumulation region 16 of $N^+$-type, a drift region 18 of $N^-$-type, a buffer region 20 of $N^-$-type, a collector region 22 of $P^+$-type, and a cathode region 82 of $N^+$-type.

The accumulation region 16 is formed on the back surface side of the base region 14. The accumulation region 16 is formed at a concentration higher than the impurity concentration in the drift region 18. In one example, the accumulation region 16 is formed by implanting N-type impurities such as phosphorus from the front surface side of the semiconductor substrate 10.

Also, the accumulation region 16 is formed in a mesa portion of the semiconductor substrate 10. In the present specification, the mesa portion of the semiconductor substrate 10 refers to a plateau-like portion sandwiched between the trench portions. Although the mesa portion of the present example is shown as the portion sandwiched between the dummy trench portion 30 and the gate trench portion 40, it is not limited to the present example as long as it is a region sandwiched between trench portions. For example, the accumulation region 16 is formed in the mesa portion between the dummy trench portion 30 and the gate trench portion 40. The accumulation region 16 may be provided to cover each region between the dummy trench portion 30 and the gate trench portion 40. Providing the accumulation region 16 suppresses, in the ON state, the flow of the holes into the base region 14 that are injected into the drift region 18 from the collector region 22. Consequently, this increases the injection enhancement effect of the electrons injected from the emitter region 12 into the base region 14. The ON-state voltage is thereby reduced.

The accumulation region 16 includes an accumulation region 16a and an accumulation region 16b. The accumulation region 16a is formed between a plurality of trench portions in the transistor portion 70. Part of the accumulation region 16a may also be formed in the boundary region 75. The accumulation region 16a is one example of a first accumulation region of the accumulation region 16.

The accumulation region 16b is formed between a plurality of trench portions in the boundary region 75. The accumulation region 16b is arranged on the side of the boundary with a region that is different from the accumulation region 16 in a planar view. That is, the accumulation region 16b is arranged on the outer side relative to the accumulation region 16a. Part of the accumulation region 16b may be formed in the boundary region 75. Also, in the semiconductor substrate 10, the accumulation region 16b is formed more shallowly than the accumulation region 16a is. Shallowly forming the accumulation region 16b promotes field plate effect in the boundary region 75, so that the breakdown voltage is improved.

That is, a breakdown voltage Vb2 in the region in which the accumulation region 16b is formed is higher than a breakdown voltage Vb1 in the region in which the accumulation region 16a is formed. The accumulation region 16b is one example of a second accumulation region of the accumulation region 16. The width of the accumulation region 16b of the present example is equal to the width of the mesa surrounded by the plurality of trench portions. The width of the accumulation region 16b of the present example is equal to the width between the dummy trench portion 30 and the gate trench portion 40. In the present specification, the width of the mesa refers to the width of the mesa portion in the array direction of the trench portions. That is, the width of the mesa refers to the width of the semiconductor substrate 10 between adjacent trench portions.

The drift region 18 is formed on the back surface side of the accumulation region 16. The buffer region 20 is formed on the back surface side of the drift region 18. The impurity concentration in the buffer region 20 is higher than the impurity concentration in the drift region 18. The buffer region 20 may function as a field stop layer to prevent a depletion layer that spreads from the back surface side of the base region 14 from reaching the collector region 22 and the cathode region 82.

In the region of the transistor portion 70, the collector region 22 is formed on the back surface side of the buffer region 20. In the region of the diode portion 80, the cathode region 82 is formed on the back surface side of the buffer region 20. Also, the collector electrode 24 is provided on the back surface of the collector region 22 and on the back surface of the cathode region 82.

Note that on the back surface side of the boundary region 75, the collector region 22 may be formed, and the cathode region 82 may also be formed. In the present example, the collector region 22 is formed.

One or more gate trench portions 40, one or more dummy trench portions 30, and one or more emitter trench portions 60 are formed on the front surface side of the semiconductor substrate 10. Each trench portion extends from the front surface of the semiconductor substrate 10 and penetrates the base region 14 to reach the drift region 18. In the present example, the gate trench portion 40 and the dummy trench portion 30 extend from the front surface of the semiconductor substrate 10 and penetrate the emitter region 12, the base region 14 and the accumulation region 16 to reach the drift region 18. Also, the emitter trench portion 60 extends from the front surface of the semiconductor substrate 10 and penetrates the base region 14 and the accumulation region 16 to reach the drift region 18.

The gate trench portion 40 has an insulating film 42 and a gate conductive portion 44 formed on the front surface side of the semiconductor substrate 10.

In the gate trench portion 40, the gate conductive portion 44 is formed on the front surface side of the semiconductor substrate 10. The gate conductive portion 44 includes at least a region opposed to an adjacent base region 14. Each gate conductive portion 44 is electrically connected to a gate terminal 51. In the present example, in the protruding portion 43 as shown in FIG. 1, the gate conductive portion 44 is electrically connected to the gate metal layer 50. Also, the gate metal layer 50 is electrically connected to the gate terminal 51. If a predetermined voltage is applied to the gate conductive portion 44 via the gate terminal 51, a channel is formed on an outer layer of the interface of the base region 14, with the outer layer contacting the gate trench. The gate conductive portion 44 of the present example is formed of conductive material such as polysilicon. The gate conductive portion 44 is one example of a first conductive portion of the gate trench portion 40.

The insulating film 42 is formed to cover the gate conductive portion 44. That is, the insulating film 42 insulates the gate conductive portion 44 and the semiconductor substrate 10 from each other. The insulating film 42 may be formed by oxidizing or nitriding a semiconductor of the inner wall of the gate trench.

The dummy trench portion 30 has an insulating film 32 and a dummy conductive portion 34 formed on the front surface side of the semiconductor substrate 10.

In the dummy trench portion 30, the dummy conductive portion 34 is formed on the front surface side of the semiconductor substrate 10. The dummy conductive portion 34 may be formed of the same material as that of the gate conductive portion 44.

For example, the dummy conductive portion 34 is formed of conductive material such as polysilicon. The dummy conductive portion 34 may have the same length in the depth direction as that of the gate conductive portion 44. The dummy conductive portion 34 is one example of a first conductive portion of the dummy trench portion 30.

The insulating film 32 is formed to cover side surfaces and a bottom surface of the dummy conductive portion 34. That is, the insulating film 32 insulates the dummy conductive portion 34 and the semiconductor substrate 10 from each other. The insulating film 32 may be formed by oxidizing or nitriding a semiconductor of the inner wall of the dummy trench.

The diode portion 80 is provided in a region in the vicinity of the transistor portion 70. The diode portion 80 has the base region 14, the drift region 18, and the buffer region 20, which are the same layers as those in the transistor portion 70. The cathode region 82 is provided on the back surface side of the buffer region 20 in the diode portion 80. Also, the diode portion 80 has one or more emitter trench portions 60. Also, the emitter region 12 is not formed in the diode portion 80.

The emitter trench portion 60 is formed to extend from the front surface side of the base region 14, penetrate the base region 14 and the accumulation region 16, and reach the drift region 18. Each emitter trench portion 60 includes an insulating film 62 and an emitter conductive portion 64.

In the emitter trench portion 60, the emitter conductive portion 64 is formed on the front surface side of the semiconductor substrate 10. The emitter conductive portion 64 is electrically connected to the emitter terminal 53.

The insulating film 62 is formed to cover side surfaces and a bottom surface of the emitter conductive portion 64. Also, the insulating film 62 is formed to cover the inner wall of the emitter trench.

The boundary region 75 refers to a region that is in the transistor portion 70 on the side of the boundary with another region in a planar view, and in which the emitter region 12 is not formed. At one end of the array direction in the transistor portion 70, the emitter region 12 is not formed between the plurality of trench portions in the boundary region 75 of the present example. In one example, the one end of the array direction in the transistor portion 70 refers to a region that is in the transistor portion 70 on the positive side of the X axis direction and is at the boundary with the diode portion 80. The boundary region 75 of the present example has the contact region 15 in the front surface of the semiconductor substrate 10 in the boundary region 75.

Comparative Example 1

Figure 3:
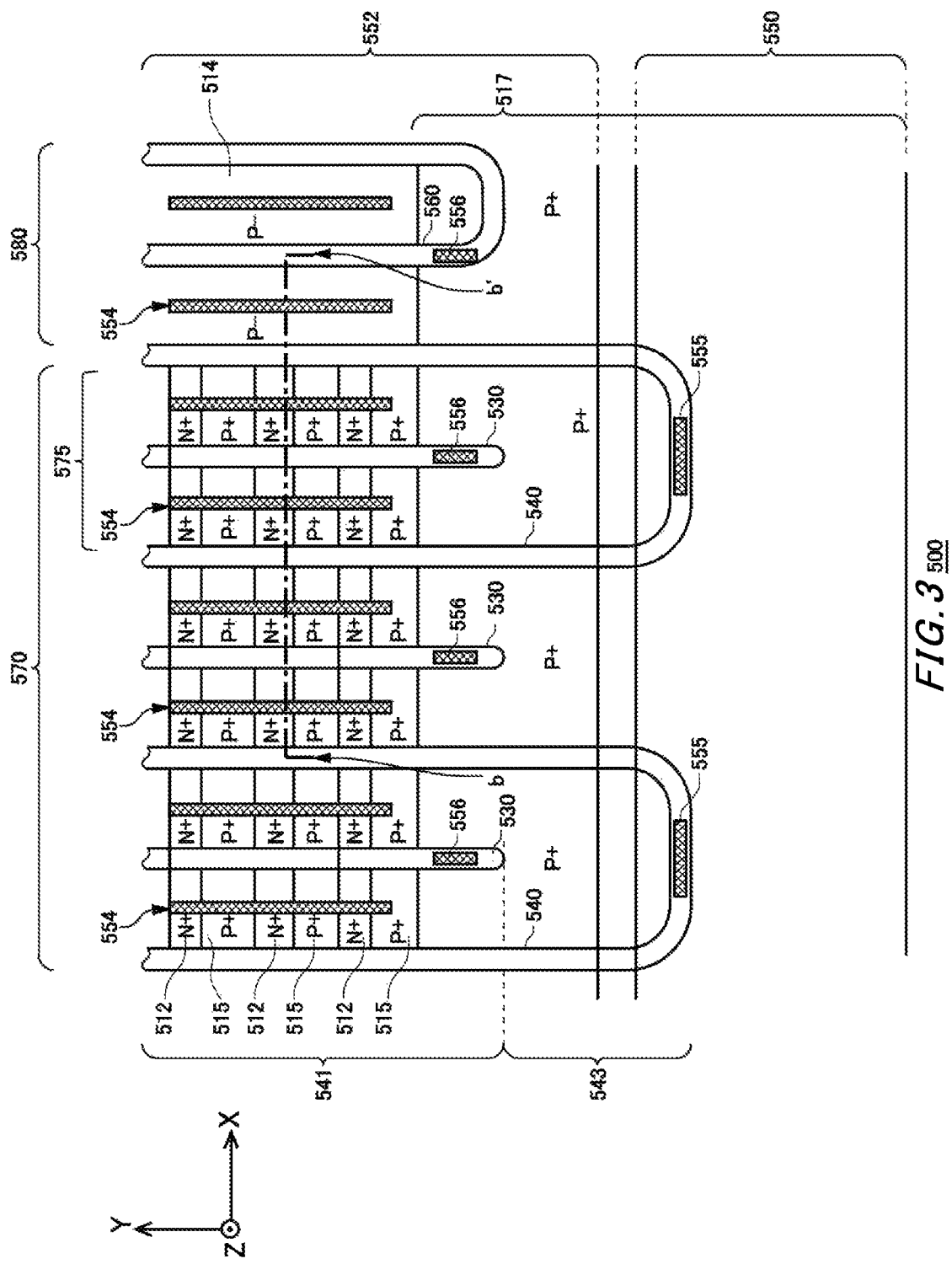
FIG. 3 is a plan view showing one example of a semiconductor device 500 according to Comparative Example 1.
Figure 4:
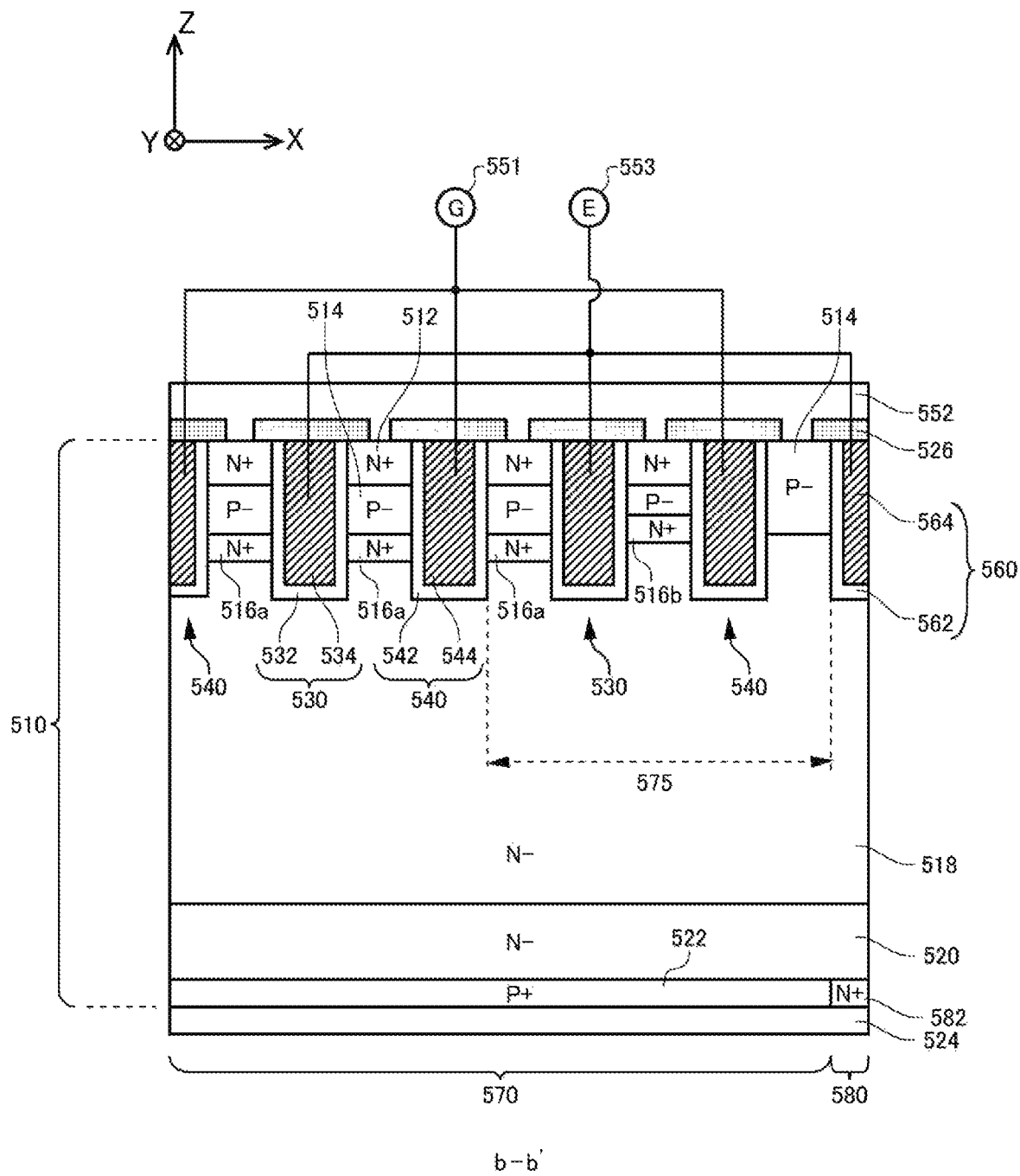
FIG. 4 shows one example of a cross section taken along b-b' in the semiconductor device 500 according to the Comparative Example 1.

FIG. 3 is a plan view showing one example of a semiconductor device 500 according to Comparative Example 1. FIG. 4 shows one example of a cross section taken along b-b' in the semiconductor device 500 according to the Comparative Example 1. The semiconductor device 500 of the present example differs from the semiconductor device 100 according to Example 1 in that an emitter region 512 is formed also in a region 575.

The semiconductor device 500 of the present example includes a transistor portion 570 and a diode portion 580. In or on a front surface of a semiconductor substrate 510, the semiconductor device 500 includes the emitter region 512, a base region 514, a contact region 515, an accumulation region 516, a well region 517, an interlayer insulating film 526, a dummy trench portion 530, a gate trench portion 540, an emitter trench portion 560, a gate metal layer 550, and an emitter electrode 552. The dummy trench portion 530 has an insulating film 532 and a dummy conductive portion 534, and the gate trench portion 540 has an insulating film 542 and a gate conductive portion 544. The emitter trench portion 560 has an insulating film 562 and an emitter conductive portion 564. The accumulation region 516 includes an accumulation region 516a and an accumulation region 516b.

Also, the semiconductor device 500 of the present example has a drift region 518, a buffer region 520, a collector region 522 and a cathode region 582 formed in the semiconductor substrate 510. A collector electrode 524 is formed on the back surface side of the semiconductor substrate 510. Note that the gate metal layer 550 is connected to a gate terminal 551 and is connected to the semiconductor substrate 510 via a contact hole 555. Also, the emitter electrode 552 is connected to an emitter terminal 553 and is connected to the semiconductor substrate 510 via a contact hole 554 or a contact hole 556.

A region 575 is formed in the transistor portion 570 on the side of the boundary with another region in a planar view. The region 575 has an accumulation region 516b, which is a shallowly formed accumulation region 516. Here, the region 575 has the emitter region 512 in the front surface of the semiconductor substrate 510. Because of this, the distance between the emitter region 512 and the accumulation region 516b is shortened in the region 575. A gate threshold of the semiconductor device 500 is thereby lowered.

Example 2

Figure 5:
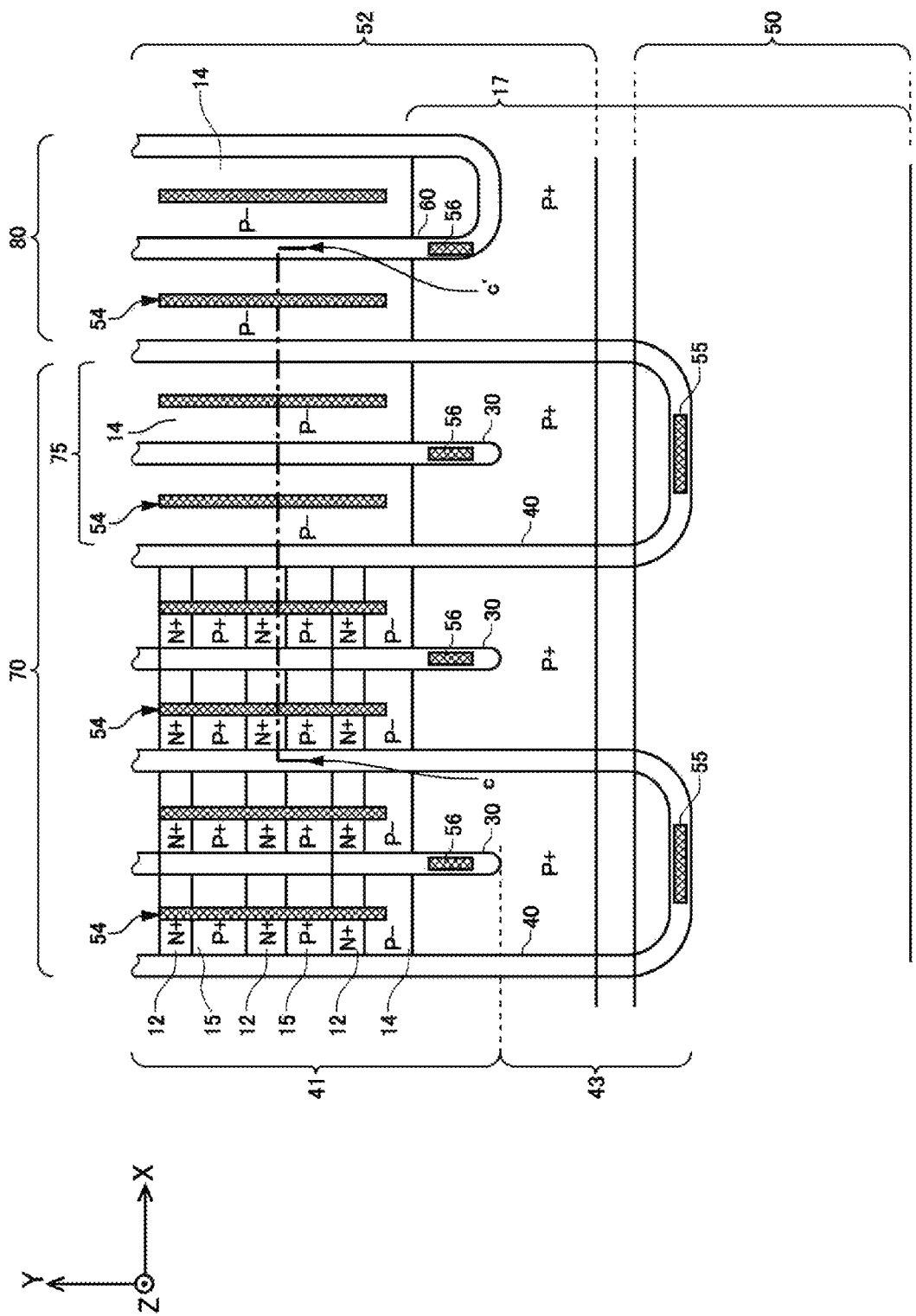
FIG. 5 is a plan view showing one example of the semiconductor device 100 according to Example 2.
Figure 6:
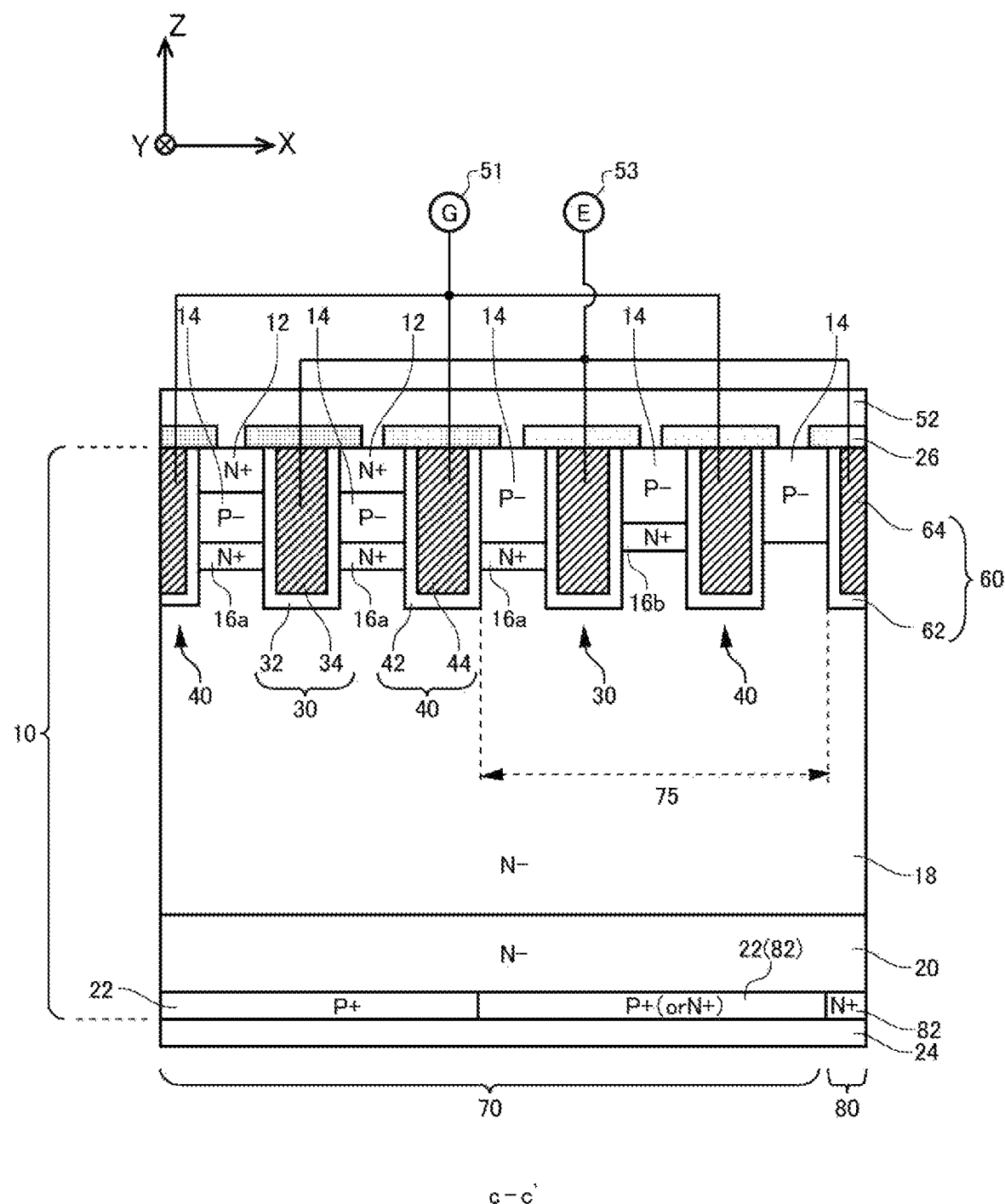
FIG. 6 is a diagram showing one example of a cross section taken along c-c' in the semiconductor device 100 according to the Example 2.

FIG. 5 is a plan view showing one example of the semiconductor device 100 according to Example 2. FIG. 6 is a diagram showing one example of a cross section taken along c-c' in the semiconductor device 100 according to the Example 2. The semiconductor device 100 of the present example has a boundary region 75 that is in the transistor portion 70 on the side of the boundary with another region and in which the emitter region 12 is not formed. At the cross section taken along c-c' in the semiconductor device 100, the boundary region 75 of the present example corresponds to the range from a region in which the emitter region 12 is not formed, to a region on the transistor portion 70 side of the emitter trench portion 60. The semiconductor device 100 of the present example differs from the semiconductor device 100 according to the Example 1 in that the semiconductor device 100 of the present example has the base region 14 in the front surface of the semiconductor substrate 10 in the boundary region 75. Thus, in the semiconductor device 100, the contact region 15 may not be formed in the front surface of the semiconductor substrate 10 in the boundary region 75.

In the boundary region 75, the semiconductor device 100 of the present example does not have the emitter region 12, similarly to the semiconductor device 100 according to the Example 1. Because of this, the distance between the emitter region 12 and the accumulation region 16b is not shortened even if the accumulation region 16b is shallowly formed in the boundary region 75. Therefore, the semiconductor device 100 of the present example can suppress decrease in the gate threshold in the boundary region 75.

Figure 7:
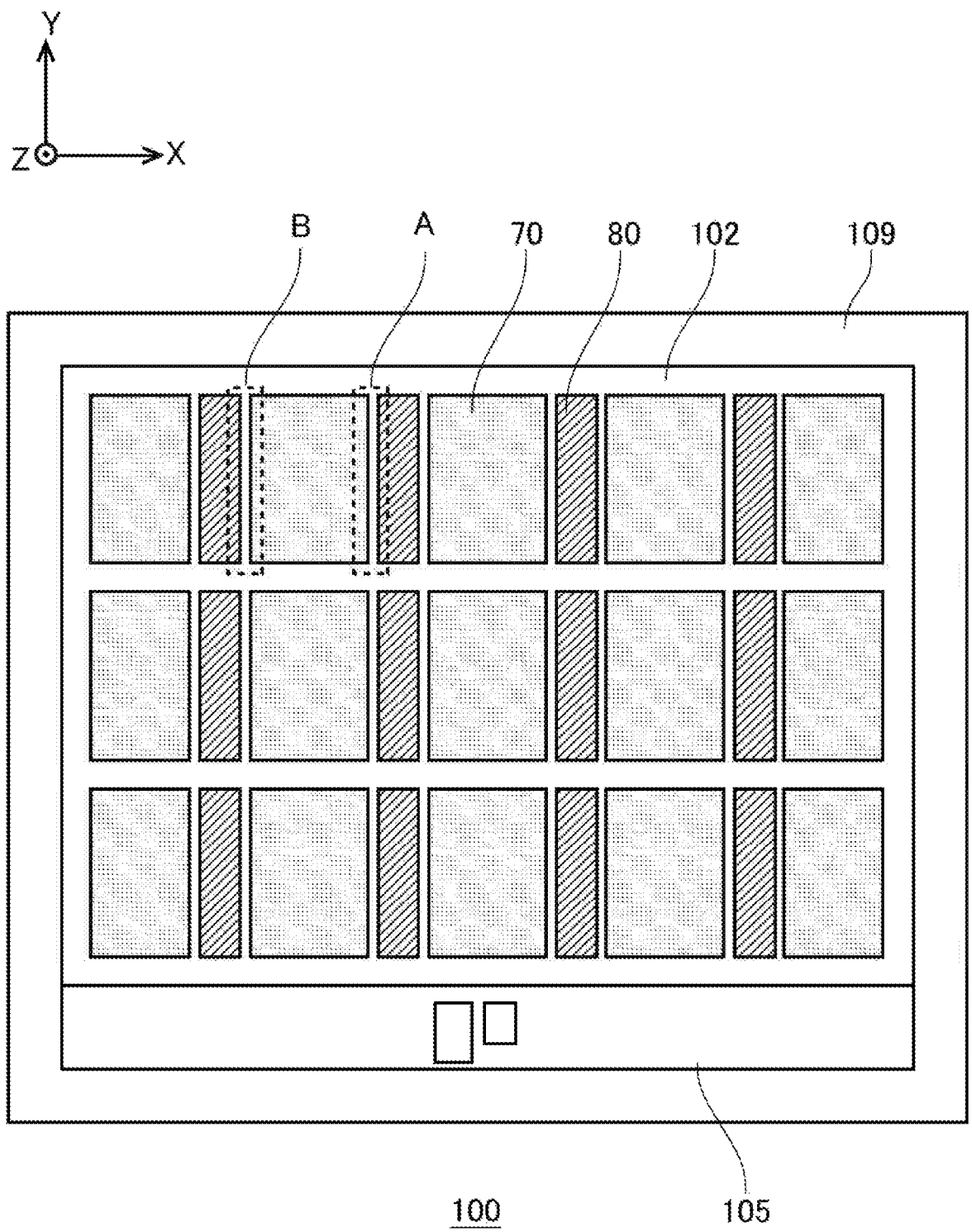
FIG. 7 shows one example of a plan view of the semiconductor device 100.

FIG. 7 shows one example of a plan view of the semiconductor device 100. The semiconductor device 100 of the present example is a semiconductor chip that has the semiconductor substrate 10 in which an active region 102 and an outside region 105 are formed.

The active region 102 is a region in which the current flows when the semiconductor device 100 is driven. In the active region 102, a plurality of transistor portions 70 and diode portions 80 are provided. The transistor portions 70 and the diode portions 80 are alternately arranged in the X axis direction in the active region 102. Also, three rows each including the transistor portions 70 and the diode portions 80 are formed in the Y axis direction.

The outside region 105 is provided outside the active region 102. The expression of 'outside the active region 102' refers to a region that is not surrounded by the active region 102 and that is closer to an end portion of the semiconductor substrate 10 than to the center of the active region 102. The outside region 105 may also surround the active region 102. In one example, the outside region 105 includes a gate pad, a sensing portion, and a temperature detecting portion. Also, a region such as an edge termination region 109 may be provided on the further outer side relative to the outside region 105.

A region A refers to a region where the boundary on the +X side of the transistor portion 70 and the boundary on the −X side of the diode portion 80 face each other. In one example, the boundary region 75 is formed in the region of the transistor portion 70 in the region A.

A region B refers to a region where the boundary on the −X side of the transistor portion 70 and the boundary on the +X side of the diode portion 80 face each other. In one example, the boundary region 75 is formed in the region of the transistor portion 70 in the region B. Note that boundary region 75 may be formed in the region of the transistor portion 70 in both of the region A and the region B.

The region A and the region B each include a boundary between the transistor portion 70 and the diode portion 80. Also, the accumulation region 16 is formed only in the transistor portion 70 and not formed in the diode portion 80. Because of this, when the ion implantation is performed for the accumulation region 16, end portions of a resist for the ion implantation are arranged on the region A and the region B. Because of this, the accumulation region 16b is shallowly formed in the region A and the region B.

The arrangement of the transistor portion 70 and the diode portion 80 of the present example is merely an example. The arrangement of the transistor portion 70 and the diode portion 80 may be appropriately changed according to the specification of the semiconductor device 100. That is, a region in which the boundary region 75 is made may be changed according to the arrangement of the transistor portion 70.

Figure 8:
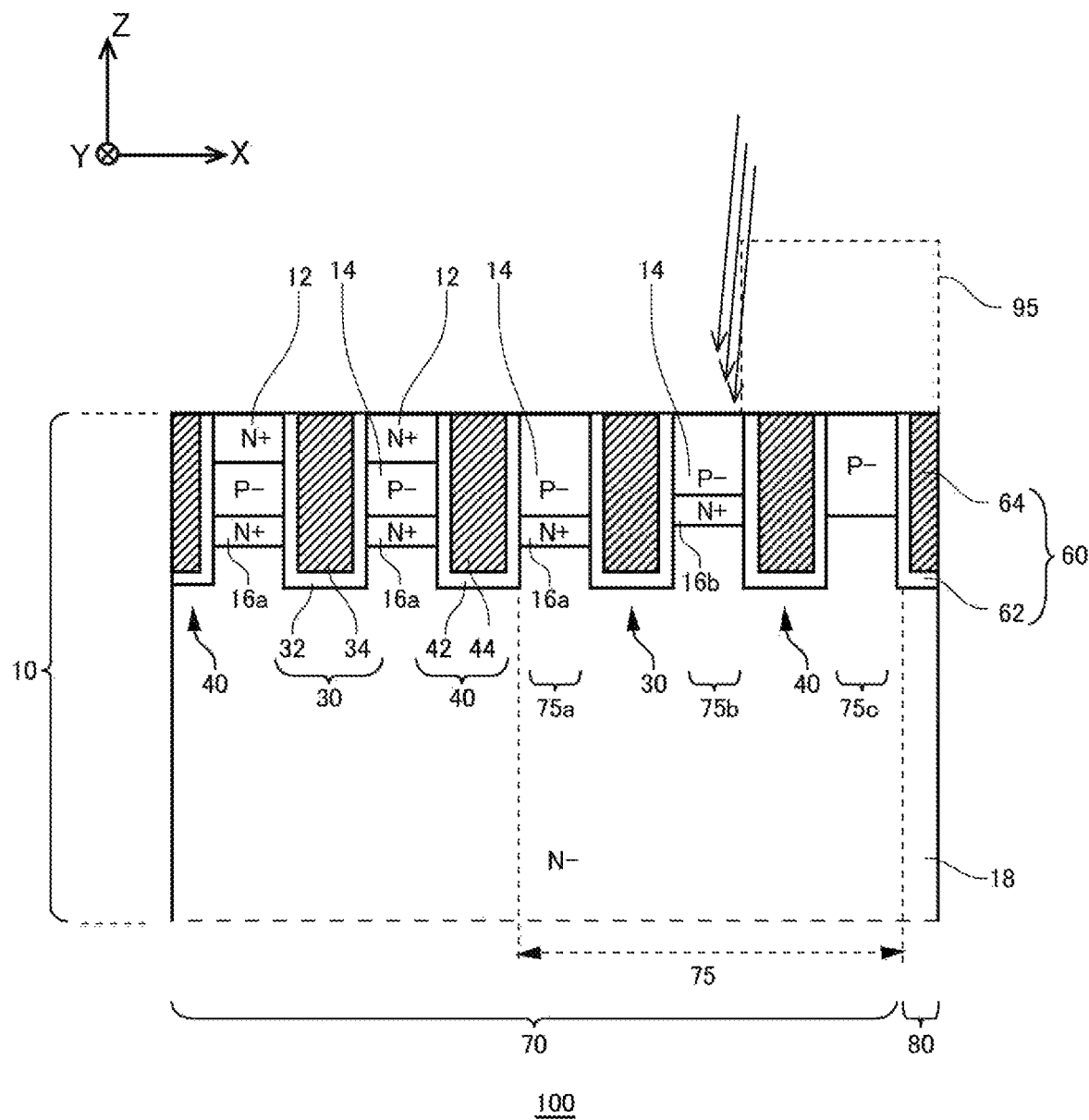
FIG. 8 shows an outline of a method for forming an accumulation region 16 in a region A shown in FIG. 7.
Figure 9:
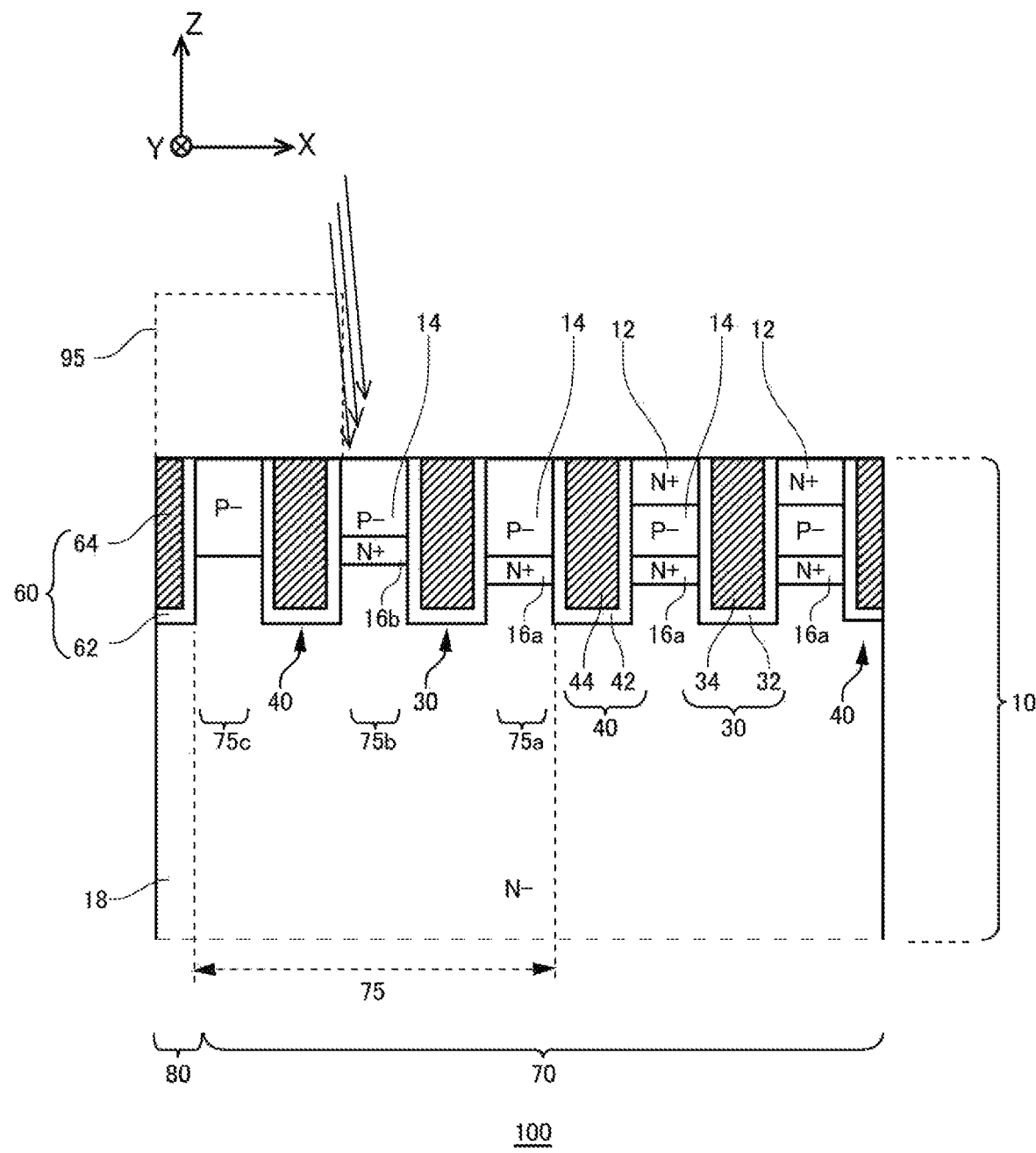
FIG. 9 shows an outline of a method for forming the accumulation region 16 in a region B shown in FIG. 7.

FIG. 8 shows an outline of a method for forming the accumulation region 16 in the region A shown in FIG. 7. FIG. 9 shows an outline of a method for forming the accumulation region 16 in the region B shown in FIG. 7.

The ion implantation may be performed with high acceleration in some case because the accumulation region 16 needs to be formed in a region deeper than the base region 14. Also, if the ion implantation is performed with high acceleration, the ion implantation is performed at a predetermined angle in order to prevent channeling from causing the ions to be implanted into a position deeper than the target position. If the ion implantation is performed at the predetermined angle, a resist 95 may decelerate the ions in the vicinity of an end portion of the resist 95 in some cases, as in the region A and the region B shown in FIG. 7. Because of this, the ions may be implanted into a position shallower than the target position in the region A or the region B in some cases.

For example, if the ion implantation is performed at a predetermined angle from the +X direction toward the −X direction, the accumulation region 16b is formed in the region A. On the other hand, if the ion implantation is performed at a predetermined angle from the −X direction toward the +X direction, the accumulation region 16b is formed in the region B.

The boundary region 75 of the present example has three mesa portions having different structures. The boundary region 75 has three regions of a boundary region 75a, a boundary region 75b, and a boundary region 75c depending on the structures of the mesa portions. The boundary region 75a, the boundary region 75b, and the boundary region 75c are common in that none of these regions has the emitter region 12.

Relative to the boundary region 75b and the boundary region 75c, the boundary region 75a is provided on the side opposite to the side at which the diode portion 80 is provided. The boundary region 75a is a region in which the base region 14 and the accumulation region 16a are formed between the dummy trench portion 30 and the gate trench portion 40.

The boundary region 75b is provided between the boundary region 75a and the boundary region 75c. The boundary region 75b is a region in which the base region 14 and the accumulation region 16b are formed between the dummy trench portion 30 and the gate trench portion 40.

Relative to the boundary region 75a and the boundary region 75b, the boundary region 75c is provided in the boundary region 75 on the diode portion 80 side. The boundary region 75c is a region in which only the base region 14 is formed between the gate trench portion 40 and the emitter trench portion 60. Also, in the boundary region 75c, the base region 14 is connected to the drift region 18 between the gate trench portion 40 and the emitter trench portion 60. In other words, in the boundary region 75c, the accumulation region 16 is not formed between the gate trench portion 40 and the emitter trench portion 60. In the semiconductor device 100, the breakdown voltage can thereby be improved in the boundary region 75 in which an electric field is concentrated. Also, it becomes easier to extract holes in the region in which the accumulation region 16 is not formed. For at least one trench, the boundary region 75 preferably has the boundary region 75c in which the accumulation region 16 is not formed.

Note that, at one end of the array direction in the transistor portion 70, the boundary region 75 of the present example is formed to be adjacent to the diode portion 80. However, as shown in FIG. 8 and FIG. 9, the boundary region 75 may be formed at both of the one end of the transistor portion 70 and the other end opposite to the one end. In this case, after the ion implantation is performed for the accumulation region 16, the ion implantation is performed again on the semiconductor device 100, with the implantation direction rotated 180 degrees. For example, the ion implantation is performed on the semiconductor device 100 from the −X direction toward the +X direction after the ion implantation is performed from the +X direction toward the −X direction. In the semiconductor device 100, the accumulation region 16b can thereby be formed on both of the +X side of the transistor portion 70 and the −X side of the transistor portion 70.

Figure 10:
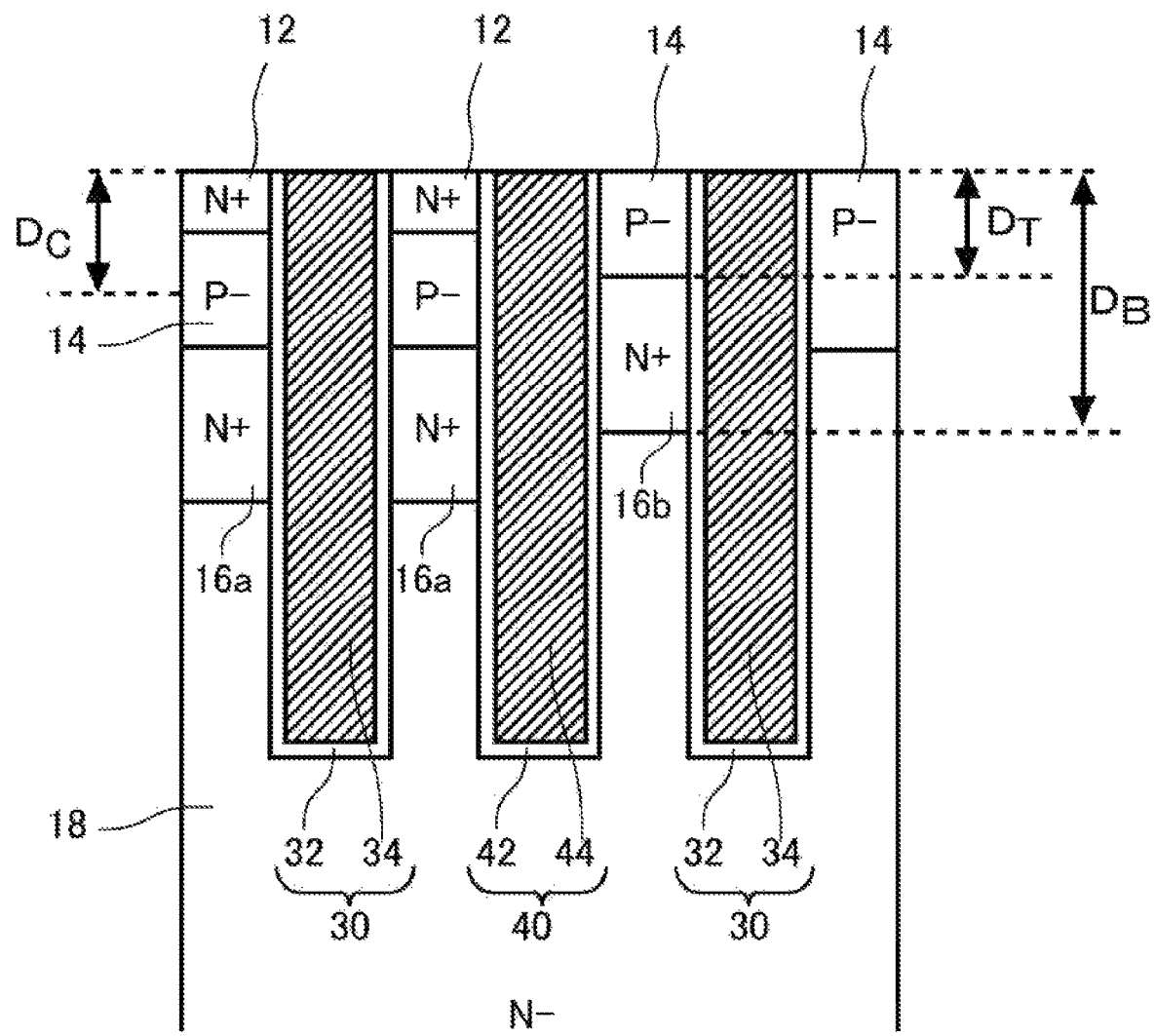
FIG. 10 shows one example of a structure with the vicinity of trench portions enlarged.

FIG. 10 shows one example of a structure with the vicinity of the trench portions enlarged. FIG. 10 extracts and shows only part of the structure in order to describe the dimension of the vicinity of the dummy trench portion 30 and the gate trench portion 40.

The accumulation region 16b may include a region formed at a depth at least as deep as the central position of the base region 14 in a depth direction. That is, the accumulation region 16b is formed shallowly to the extent of including a depth as deep as the central position of the base region 14 in the depth direction. Here, assuming that $D_C$ is the depth of the central position of the base region 14, $D_T$ is a depth of the upper end of the accumulation region 16b from the front surface of the semiconductor substrate 10, and $D_B$ is a depth of the lower end of the accumulation region 16b from the front surface of the semiconductor substrate 10, $D_T < D_C < D_B$ holds.

Also, an impurity concentration at the lower end of the accumulation region 16b may be lower than an impurity concentration at a lower end of the first accumulation region. That is, the reference to the accumulation region 16b to be shallowly formed in the depth direction of the semiconductor substrate 10 also indicates, in addition to the accumulation region 16b to be formed above the accumulation region 16a, that the impurity concentration distribution in the accumulation region 16b has shifted to the front surface side of the semiconductor substrate 10 more than the impurity concentration distribution of the accumulation region 16a. Note that the impurity concentration in the accumulation region 16 may be the same or higher than the impurity concentration in the base region 14. For example, the impurity concentration in the accumulation region 16 is equal to or higher than 1E16 cm$^{-3}$ and is equal to or lower than 1E18 m$^{-3}$. Note that E means the power of 10, and for example, 1E16 cm$^{-3}$ means $1 \times 10^{16}$ cm$^{-3}$.

The accumulation region 16b may be formed more shallowly by a depth in the range of equal to or greater than 0.1 μm and equal to or less than 1.0 μm than the accumulation region 16a is, and more preferably, may be formed more shallowly by a depth in the range of equal to or greater than 0.3 μm and equal to or less than 0.7 μm. For example, the accumulation region 16b is formed more shallowly by 0.5 μm than the accumulation region 16a is. The depth of the accumulation region 16b is adjusted by changing the tilt angle of the semiconductor substrate 10 when the ion implantation is performed for the accumulation region 16. Also, the depth of the accumulation region 16b is changed based on the thickness or quality of the material of the resist 95. Note that the extent to which the accumulation region 16b is shallowly made may be determined depending on the depths of the emitter region 12 and the base region 14, the depths of the trench portions, and the like. Note that the emitter region 12, the base region 14, and the accumulation region 16 of the present example respectively have 0.5 μm thickness, 1.5 μm thickness, and 2.5 μm thickness.

Example 3

Figure 11:
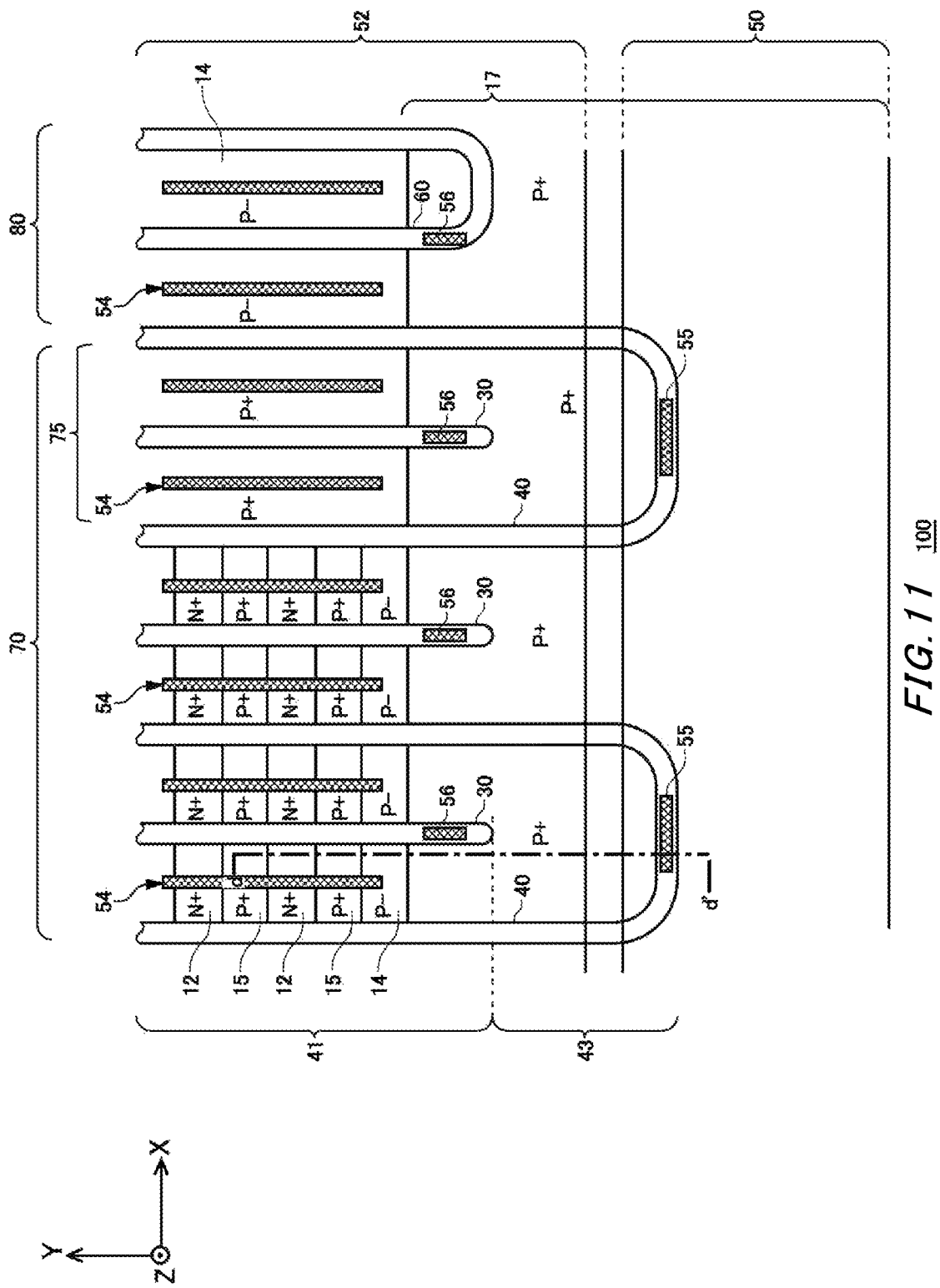
FIG. 11 shows one example of a plan view of the semiconductor device 100 according to Example 3.
Figure 12:
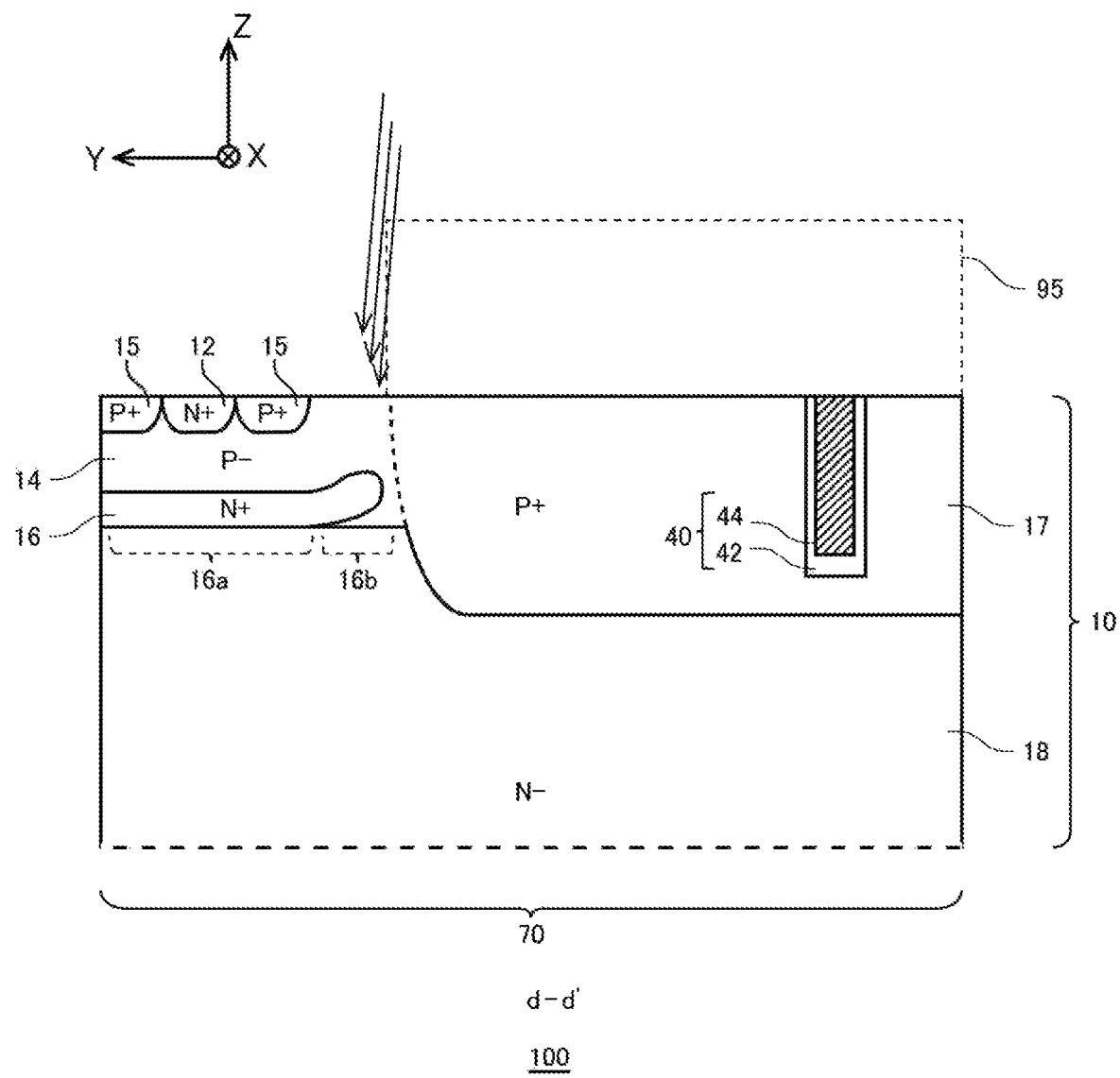
FIG. 12 is a diagram showing one example of a cross section taken along d-d' in the semiconductor device 100 according to the Example 3.

FIG. 11 shows one example of a plan view of the semiconductor device 100 according to Example 3. FIG. 12 is a diagram showing one example of a cross section taken along d-d' in the semiconductor device 100 according to Example 3.

The well region 17 is provided in the front surface of the semiconductor substrate 10 on the extending direction side to which the transistor portion 70 extends in a planar view. The well region 17 of the present example is formed on the −Y axis direction side of the transistor portion 70. However, it may be formed on the +Y axis direction side of the transistor portion 70.

The accumulation region 16b is formed in the accumulation region 16 on the side of the boundary with the well region 17 in a planar view. The accumulation region 16 of the present example is formed by performing the ion implantation from the −Y direction toward the +Y direction. Therefore, the accumulation region 16 has the accumulation region 16b in a region adjacent to the well region 17 positioned on the −Y axis direction side of the transistor portion 70. The accumulation region 16b may be spaced apart from the well region 17 without contacting the well region 17, with the base region 14 interposed therebetween.

The depth of the accumulation region 16b gradually varies in a direction parallel to the front surface of the semiconductor substrate 10. For example, the depth of the accumulation region 16b gradually becomes shallower in the direction parallel to the front surface of the semiconductor substrate 10. At the cross section taken along d-d' in the semiconductor substrate 10, the accumulation region 16b of the present example is formed to become gradually shallower toward the negative side direction of the Y axis direction. In the accumulation region 16b, a region on the −Y axis side of the accumulation region 16b may be formed more shallowly by a depth in the range of equal to or greater than 0.1 μm and equal to or less than 1.0 μm than the accumulation region 16a is, and more preferably, by a depth in the range of equal to or greater than 0.3 μm and equal to or less than 0.7 μm. For example, in the accumulation region 16b, the region on the −Y axis side of the accumulation region 16b is more shallowly formed by 0.5 μm than the accumulation region 16a is. A breakdown voltage Vb2 in the region in which the accumulation region 16b is formed thereby becomes higher than a breakdown voltage Vb1 in the region in which the accumulation region 16a is formed. Accordingly, in the semiconductor device 100 of the present example, the breakdown voltage can be increased in the region on the well region 17 side that is required to have a sufficient breakdown voltage.

Note that a breakdown voltage Vb3 in the region in which the well region 17 is formed is further higher than the breakdown voltage Vb1 and the breakdown voltage Vb2. Also, as described above, by sandwiching, between the accumulation region 16b and the well region 17, the base region 14 having the impurity concentration lower than that of the well region 17, the electric field strength can be relaxed, so that the breakdown voltage Vb2 can be further improved.

The semiconductor device 100 may be used in combination with the ion implantation methods according to the Example 1 and the Example 2. In one example, in the semiconductor device 100, the accumulation region 16 is formed by both of the method according to the Example 1 for performing the ion implantation tilted toward the X axis direction and the method according to Example 3 for performing the ion implantation tilted toward the Y axis direction. For example, with respect to the semiconductor device 100, the method of tilting the device toward the X axis direction and the method of tilting the device toward the Y axis direction are separately performed so that the impurity concentration in the accumulation region 16 may have a predetermined value. In the semiconductor device 100, the accumulation region 16 can thereby be shallowly formed on all of the boundary sides of the transistor portion 70, which are the +X axis direction side, the −X axis direction side, the +Y axis direction side, and the −Y axis direction side. In this case, in the semiconductor device 100, the breakdown voltage in the vicinity of all of the boundaries around the transistor portion 70 can be improved.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device including a transistor portion and a diode portion, comprising:
    a semiconductor substrate;
    a drift layer of a first conductivity type formed in the semiconductor substrate;
    a base region of a second conductivity type formed in the semiconductor substrate and above the drift layer; and
    an accumulation region of the first conductivity type provided between the drift layer and the base region and having an impurity concentration higher than an impurity concentration in the drift layer,
    wherein the transistor portion has:
    a plurality of trench portions that are formed in a front surface of the semiconductor substrate and are arrayed in a predetermined direction; and
    a plurality of mesa portions, each mesa portion formed between adjacent trench portions among the plurality of trench portions;
    an emitter region of the first conductivity type formed in the plurality of mesa portions in the front surface of the semiconductor substrate and having an impurity concentration higher than the impurity concentration in the drift layer;
    a collector region provided on a back surface side of the semiconductor substrate; and
    a boundary region having at least one of the plurality of mesa portions in which the emitter region is not formed in the at least one of the plurality of mesa portions in the boundary region between the plurality of trench portions, and the emitter region is not formed at one end of the plurality of mesa portions of an array direction in the transistor portion,
    wherein the transistor portion extends, in the array direction, from a region at which the emitter region is provided to the boundary region,
    the accumulation region extends, in the array direction, from a region at which the emitter region is provided to an inside of the boundary region such that an end of one of the plurality of mesa portions of the accumulation region is positioned within the boundary region,
    the accumulation region is not formed in the diode region, and
    an end portion of the collector region is closer, in the array direction, to the diode portion than the end mesa portion of the accumulation region.

2. The semiconductor device according to claim 1, wherein the diode portion includes a cathode region of the first conductivity type on the back surface side of the semiconductor substrate.

3. The semiconductor device according to claim 1, wherein a mesa portion in which an emitter region being closest to the diode portion in the array direction is provided contacts a gate trench portion at a side of the diode portion.

4. The semiconductor device according to claim 1, wherein the boundary region further comprises a dummy trench portion.

5. The semiconductor device according to claim 4, wherein
    the base region is formed on the front surface of the semiconductor substrate, the emitter region is provided on a front surface of the base region, and
    the semiconductor device further comprises an emitter electrode that contacts at least the emitter region,
    wherein
    a gate trench portion extends from a front surface of the emitter region and penetrates the base region and the accumulation region to reach the drift region,
    the gate trench portion includes a first insulating film covering an inside of the gate trench portion and a gate conductive portion insulated from the semiconductor substrate interposed with the first insulating film, the gate trench portion being electrically connected to a gate electrode, and
    the dummy trench portion includes a second insulating film covering an inside of the dummy trench portion and a dummy conductive portion insulated from the semiconductor substrate interposed with the second insulating film.

6. The semiconductor device according to claim 5, wherein the dummy conductive portion is electrically connected to the emitter electrode.

7. The semiconductor device according to claim 5, wherein
    the diode portion includes an emitter trench portion having an emitter potential, wherein
    the emitter trench portion includes a third insulating film covering an inside of the emitter trench portion and an emitter conductive portion insulated from the semiconductor substrate interposed with the third insulating film, the emitter conductive portion being electrically connected to the emitter electrode.

8. The semiconductor device according to claim 1, wherein the boundary region includes a contact region of the second conductivity type on the front surface of the semiconductor substrate, having an impurity concentration higher than an impurity concentration in the base region.

9. A semiconductor device including a transistor portion and a diode portion, comprising:
    a semiconductor substrate;
    a drift layer of a first conductivity type formed in the semiconductor substrate;
    a base region of a second conductivity type formed in the semiconductor substrate and above the drift layer; and
    an accumulation region of the first conductivity type provided between the drift layer and the base region and having an impurity concentration higher than an impurity concentration in the drift layer,
    wherein the transistor portion has:
    a plurality of trench portions that are formed in a front surface of the semiconductor substrate and are arrayed in a predetermined direction; and
    a plurality of mesa portions between the plurality of trench portions;
    an emitter region of the first conductivity type formed in the plurality of mesa portions in the front surface of the semiconductor substrate and having an impurity concentration higher than the impurity concentration in the drift layer;

a collector region of the second conductivity type provided on a back surface side of the semiconductor substrate in a region in which the emitter region is provided; and a boundary region having at least one of the plurality of mesa portions in which the emitter region is not formed in the at least one of the plurality of mesa portions in the boundary region between the plurality of trench portions, and the emitter region is not formed at one end of the plurality of mesa portions of an array direction in the transistor portion, wherein the diode portion includes a cathode region of the first conductivity type on the back surface side of the semiconductor substrate, the cathode region is also provided on the back surface side of the semiconductor substrate in the boundary region, the accumulation region extends, in the array direction, from a region at which the emitter region is provided to an inside of the boundary region such that an end of one of the plurality of mesa portions of the accumulation region is positioned within the boundary region, the accumulation region is not formed in the diode region, and the cathode region is provided at a back surface of the end portion of the accumulation region.

10. The semiconductor device according to claim 9, wherein a mesa portion in which an emitter region being closest to the diode portion in the array direction is provided contacts a gate trench portion at a side of the diode portion.

11. The semiconductor device according to claim 9, wherein the boundary region further comprises a dummy trench portion.

12. The semiconductor device according to claim 11, wherein the base region is formed on the front surface of the semiconductor substrate, the emitter region is provided on a front surface of the base region; and the semiconductor device further comprises an emitter electrode that contacts at least the emitter region, wherein the gate trench portion extends from a front surface of the emitter region and penetrates the base region and the accumulation region to reach the drift region, the gate trench portion includes a first insulating film covering an inside of the gate trench portion and a gate conductive portion insulated from the semiconductor substrate interposed with the first insulating film, the gate trench portion being electrically connected to a gate electrode, and the dummy trench portion includes a second insulating film covering an inside of the dummy trench portion and a dummy conductive portion insulated from the semiconductor substrate interposed with the second insulating film.

13. The semiconductor device according to claim 12, wherein the dummy conductive portion is electrically connected to the emitter electrode.

14. The semiconductor device according to claim 12, wherein the diode portion includes an emitter trench portion having an emitter potential, wherein the emitter trench portion includes a third insulating film covering an inside of the emitter trench portion and an emitter conductive portion insulated from the semiconductor substrate interposed with the third insulating film, the emitter conductive portion being electrically connected to the emitter electrode.

15. The semiconductor device according to claim 9, wherein the boundary region includes a contact region of the second conductivity type on the front surface of the semiconductor substrate, having an impurity concentration higher than an impurity concentration in the base region.

16. A semiconductor device including a transistor portion and a diode portion, comprising:

a semiconductor substrate;

a drift layer of a first conductivity type formed in the semiconductor substrate;

a base region of a second conductivity type formed in the semiconductor substrate and above the drift layer;

an accumulation region of the first conductivity type provided between the drift layer and the base region and having an impurity concentration higher than an impurity concentration in the drift layer; and a well region of the second conductive type provided in a front surface of the semiconductor substrate;

wherein the transistor portion has:

a plurality of trench portions that are formed in a front surface of the semiconductor substrate and are arrayed in a predetermined direction; and a plurality of mesa portions between the plurality of trench portions;

an emitter region of the first conductivity type formed in the front surface of the semiconductor substrate and having an impurity concentration higher than the impurity concentration in the drift layer; and a contact region of the second conductivity type provided on the front surface of the semiconductor substrate and having an impurity concentration higher than an impurity concentration in the base region, wherein the contact region is positioned in an extending direction of the plurality of the trench portions outside an outermost emitter region in the extending direction in the plurality of the mesa portions, the accumulation region is provided to extend in the extending direction outside the outermost emitter region in the extending direction, and an outermost end portion of the accumulation region in the extending direction is provided inside the well region in the extending direction.

17. The semiconductor device according to claim 16, wherein the outermost emitter region in the extending direction is spaced apart from the well region.

18. The semiconductor device according to claim 16, wherein the plurality of mesa portions include an interlayer insulating film and a contact hole provided in the interlayer insulating film to connect at least an emitter electrode with the emitter region, and an outermost end portion of the contact hole in the extending direction is spaced apart from the well region.

19. The semiconductor device according to claim 16, wherein the extending direction is perpendicular to the array direction of the plurality of trench portions.

20. A semiconductor device including a transistor portion and a diode portion, comprising:

a semiconductor substrate;

a drift layer of a first conductivity type formed in the semiconductor substrate;

a base region of a second conductivity type formed in the semiconductor substrate and above the drift layer; and an accumulation region of the first conductivity type provided between the drift layer and the base region and having an impurity concentration higher than an impurity concentration in the drift layer, wherein the transistor portion has:

a plurality of trench portions that are formed in a front surface of the semiconductor substrate and are arrayed in a predetermined direction; and a plurality of mesa portions, each mesa portion formed between adjacent trench portions among the plurality of trench portions;

an emitter region of the first conductivity type formed in the plurality of mesa portions in the front surface of the semiconductor substrate and having an impurity concentration higher than the impurity concentration in the drift layer;

a collector region provided on a back surface side of the semiconductor substrate; and a boundary region in which the emitter region is not formed between the plurality of trench portions, and the emitter region is not formed at one end of an array direction in the transistor portion, wherein the transistor portion extends, in the array direction, from a region at which the emitter region is provided to the boundary region, the accumulation region extends, in the array direction, from a region at which the emitter region is provided to an inside of the boundary region such that an end of one of the plurality of mesa portions of the accumulation region is positioned within the boundary region, the accumulation region is not formed in the diode region, an end portion of the collector region is closer, in the array direction, to the diode portion than the end mesa portion of the accumulation region, and the boundary region includes a contact region of the second conductivity type on the front surface of the semiconductor substrate, having an impurity concentration higher than an impurity concentration in the base region.

21. The semiconductor device according to claim 20, wherein:

the diode portion includes a cathode region of the first conductivity type on the back surface side of the semiconductor substrate;

a mesa portion in which an emitter region being closest to the diode portion in the array direction is provided contacts a gate trench portion at a side of the diode portion;

the boundary region further comprises a dummy trench portion; and the base region is formed on the front surface of the semiconductor substrate, the emitter region is provided on a front surface of the base region, and the semiconductor device further comprises an emitter electrode that contacts at least the emitter region, wherein a gate trench portion extends from a front surface of the emitter region and penetrates the base region and the accumulation region to reach the drift region, the gate trench portion includes a first insulating film covering an inside of the gate trench portion and a gate conductive portion insulated from the semiconductor substrate interposed with the first insulating film, the gate trench portion being electrically connected to a gate electrode, and the dummy trench portion includes a second insulating film covering an inside of the dummy trench portion and a dummy conductive portion insulated from the semiconductor substrate interposed with the second insulating film.

22. The semiconductor device according to claim 21, wherein the dummy conductive portion is electrically connected to the emitter electrode.

23. The semiconductor device according to claim 21, wherein the diode portion includes an emitter trench portion having an emitter potential, wherein the emitter trench portion includes a third insulating film covering an inside of the emitter trench portion and an emitter conductive portion insulated from the semiconductor substrate interposed with the third insulating film, the emitter conductive portion being electrically connected to the emitter electrode.

24. A semiconductor device including a transistor portion and a diode portion, comprising:

a semiconductor substrate;

a drift layer of a first conductivity type formed in the semiconductor substrate;

a base region of a second conductivity type formed in the semiconductor substrate and above the drift layer; and an accumulation region of the first conductivity type provided between the drift layer and the base region and having an impurity concentration higher than an impurity concentration in the drift layer, wherein the transistor portion has:

a plurality of trench portions that are formed in a front surface of the semiconductor substrate and are arrayed in a predetermined direction; and a plurality of mesa portions between the plurality of trench portions;

an emitter region of the first conductivity type formed in the plurality of mesa portions in the front surface of the semiconductor substrate and having an impurity concentration higher than the impurity concentration in the drift layer;

a collector region of the second conductivity type provided on a back surface side of the semiconductor substrate in a region in which the emitter region is provided; and a boundary region in which the emitter region is not formed between the plurality of trench portions, and the emitter region is not formed at one end of an array direction in the transistor portion, wherein the diode portion includes a cathode region of the first conductivity type on the back surface side of the semiconductor substrate, the cathode region is also provided on the back surface side of the semiconductor substrate in the boundary region, the accumulation region extends, in the array direction, from a region at which the emitter region is provided to an inside of the boundary region such that an end portion of the accumulation region is positioned within the boundary region, the accumulation region is not formed in the diode region, the cathode region is provided at a back surface of the end portion of the accumulation region, and the boundary region includes a contact region of the second conductivity type on the front surface of the semiconductor substrate, having an impurity concentration higher than an impurity concentration in the base region.

25. The semiconductor device according to claim 24, wherein:
- a mesa portion in which an emitter region being closest to the diode portion in the array direction is provided contacts a gate trench portion at a side of the diode portion;
- the boundary region further comprises a dummy trench portion;
- the base region is formed on the front surface of the semiconductor substrate, the emitter region is provided on a front surface of the base region; and
- the semiconductor device further comprises an emitter electrode that contacts at least the emitter region, wherein
- the gate trench portion extends from a front surface of the emitter region and penetrates the base region and the accumulation region to reach the drift region,
- the gate trench portion includes a first insulating film covering an inside of the gate trench portion and a gate conductive portion insulated from the semiconductor substrate interposed with the first insulating film, the gate trench portion being electrically connected to a gate electrode,
- the dummy trench portion includes a second insulating film covering an inside of the dummy trench portion and a dummy conductive portion insulated from the semiconductor substrate interposed with the second insulating film, and
- the diode portion includes an emitter trench portion having an emitter potential, wherein
- the emitter trench portion includes a third insulating film covering an inside of the emitter trench portion and an emitter conductive portion insulated from the semiconductor substrate interposed with the third insulating film, the emitter conductive portion being electrically connected to the emitter electrode.

26. The semiconductor device according to claim 25, wherein the dummy conductive portion is electrically connected to the emitter electrode.

* * * * *